United States Patent [19]

Ivanov et al.

[11] Patent Number: 5,522,535

[45] Date of Patent: Jun. 4, 1996

[54] METHODS AND STRUCTURAL COMBINATIONS PROVIDING FOR BACKING PLATE REUSE IN SPUTTER TARGET/BACKING PLATE ASSEMBLIES

[75] Inventors: Eugene Y. Ivanov, Grove City, Ohio; Tatyana F. Grigoriva, Spartaka; Vladimir V. Boldyrev, Tereshkova, both of Russian Federation

[73] Assignee: Tosoh SMD, Inc., Grove City, Ohio

[21] Appl. No.: 339,812

[22] Filed: Nov. 15, 1994

[51] Int. Cl.$^6$ .................................................. B23K 31/02
[52] U.S. Cl. ...................... 228/122.1; 228/191; 228/194; 204/298.13
[58] Field of Search .............................. 228/122.1, 191, 228/194, 208, 264; 204/298.11, 298.12, 298.13

[56] References Cited

U.S. PATENT DOCUMENTS

| | | | |
|---|---|---|---|
| 3,141,238 | 7/1964 | Harman, Jr. | 29/498 |
| 3,296,017 | 1/1967 | Rubin | 117/119.8 |
| 3,497,944 | 3/1970 | Antle | 29/494 |
| 3,676,916 | 7/1972 | Schierding et al. | 29/419 |
| 3,839,780 | 10/1974 | Freedman et al. | 29/501 |
| 3,949,118 | 4/1976 | Nagano et al. | 427/57 |
| 3,999,962 | 12/1976 | Drui et al. | 51/307 |
| 4,007,040 | 2/1977 | Kropp | 75/165 |
| 4,015,948 | 4/1977 | Tsuda | 75/157.5 |
| 4,278,622 | 7/1981 | Suh | 264/11 |
| 4,299,629 | 11/1981 | Haack | 75/251 |
| 4,312,896 | 1/1982 | Armstrong | 427/96 |
| 4,321,289 | 3/1982 | Bartsch | 427/287 |
| 4,342,816 | 7/1982 | Lauterback et al. | 427/34 |
| 4,459,166 | 7/1984 | Dietz et al. | 156/89 |
| 4,486,631 | 12/1984 | Naya et al. | 200/144 B |
| 4,544,091 | 10/1985 | Hidler et al. | 228/208 |
| 4,624,871 | 11/1986 | Maximovich et al. | 427/431 |
| 4,690,745 | 9/1987 | Klein | 204/192.29 |
| 4,739,920 | 4/1988 | Kujas | 228/207 |
| 4,747,889 | 5/1988 | Nishio et al. | 148/437 |
| 4,931,092 | 6/1990 | Cisar et al. | 75/244 |
| 5,010,387 | 4/1991 | Dunaway et al. | 357/70 |
| 5,010,388 | 4/1991 | Sasame et al. | 357/70 |
| 5,021,300 | 6/1991 | Stacey | 428/620 |
| 5,066,544 | 11/1991 | Betrobet et al. | 428/614 |
| 5,066,614 | 11/1991 | Dunaway et al. | 437/209 |
| 5,108,973 | 4/1992 | Satek et al. | 502/204 |
| 5,126,102 | 6/1992 | Takahashi et al. | 419/2 |
| 5,186,379 | 2/1993 | Helber, Jr. | 228/116 |

(List continued on next page.)

FOREIGN PATENT DOCUMENTS

| | | |
|---|---|---|
| 196529 | 6/1967 | U.S.S.R. |
| 241949 | 8/1969 | U.S.S.R. |
| 245526 | 10/1969 | U.S.S.R. |
| 264140 | 6/1970 | U.S.S.R. |
| 288522 | 2/1971 | U.S.S.R. |
| 562399 | 8/1977 | U.S.S.R. |
| 579109 | 11/1977 | U.S.S.R. |
| 4725973 | 3/1990 | U.S.S.R. |

OTHER PUBLICATIONS

"Mat. Sci & Tech" ed. Cahn, Haasen & Kramer, vol. 15 ed. R. Cahn; Mechanical Milling and Alloying, Chapter 5 VCH Winheim, Germany, 1991.
Reactive Mechanical Alloys In Material Synthesis E. Ivanov; Journal of Materials Synthesis and Processing, vol. 1, No. 6, 1993.

*Primary Examiner*—Samuel M. Heinrich
*Attorney, Agent, or Firm*—Biebel & French

[57] ABSTRACT

Methods for facilitating recycling of backing plates in bonded target/backing plate assemblies and structural assemblies for use in these methods are disclosed. The target and backing plate are joined by a solder paste material that may be applied to adjoining surfaces of the target and backing plate at low temperature. The paste solidifies to have a high decomposition temperature on the order of greater than 400° C. Provision of a solder layer having a liquidus temperature of about 100°–250° C. between the backing plate and solder paste allows for easy target and backing plate separation and subsequent backing plate reusage.

29 Claims, 2 Drawing Sheets

U.S. PATENT DOCUMENTS

| | | | |
|---|---|---|---|
| 5,248,079 | 9/1993 | Li | 228/121 |
| 5,266,522 | 11/1993 | DiGiacomo et al. | 437/192 |
| 5,269,899 | 12/1993 | Fan | 204/298.09 |
| 5,280,414 | 1/1994 | Davis et al. | 361/795 |
| 5,282,943 | 2/1994 | Lannutti et al. | 204/192.12 |
| 5,296,242 | 3/1994 | Zander | 424/717 |
| 5,333,726 | 8/1994 | Makowiecki et al. | 204/298.12 |
| 5,426,075 | 6/1995 | Perino et al. | 204/192.15 |

METHODS AND STRUCTURAL COMBINATIONS PROVIDING FOR BACKING PLATE REUSE IN SPUTTER TARGET/BACKING PLATE ASSEMBLIES

FIELD OF THE INVENTION

The present invention pertains to methods for separating backing plates from associated sputter targets after the target has been consumed during the cathodic sputter process so as to provide for backing plate recycling. Target/backing plate structural combinations that facilitate these methods are also disclosed.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, epoxy cements, or with interlocking annular members.

Heretofore, it has proven difficult to solder bond many target materials to backing plate members wherein the differences in the coefficients of thermal expansion between the materials was great. In these cases, concurrent heating of the parts to the temperatures needed for solder application caused part warpage and deterioration and bond failure. In order to alleviate this problem, the use of low application temperature solder paste materials to bond targets to backing plates has been developed. These solder pastes and their use to bond sputter targets to backing plates are described in concurrently pending patent applications of common assignment herewith.

These solder pastes are applied to the target/backing plate interfacial area at low temperature. Upon solidification, these materials form strong, tenacious bonds that easily withstand the operating temperatures experienced during the sputtering process. Decomposition temperatures of these materials have been reported as being as high as 400°–600° C., with solidification and solder paste application temperatures ranging from about ambient to 100° C.

Target materials are consumed as part of the sputtering process and, accordingly, targets must be periodically replaced in order to continue the coating process. Although the consumed targets must be replaced, due to the expense of the backing plates which may, for example, be composed of copper, aluminum, or stainless steel, it is desirable that the backing plates are readily separated from the spent targets and attached to a new target for reuse in the sputtering process.

It is accordingly an object of the invention to provide a convenient method for joining a target and backing plate and then disassembling the joined target and backing plate in such a way that the backing plate may be reused again in the sputtering process.

It is an even more specific object to provide a method in which a high decomposition temperature solder paste may be used as the bonding means to bond the target to backing plate but in which after the target has been consumed during sputtering, the backing plate can be readily separated from the target and high decomposition temperature solder paste so that it may be recycled for subsequent usage.

These and other objects are met by the methods and structures herein disclosed.

SUMMARY OF THE INVENTION

It has been discovered that application of a thin layer of solder material to a backing plate surface prior to bonding of the target to the surface via the use of the high decomposition temperature solder paste, will facilitate easy separation of the target from the backing plate.

In order to separate the joined target/backing plate combination, this thin layer of solder material is heated to its liquidus temperature. The target and adherent high decomposition temperature solder paste simply slide off the backing plate. The backing plate can be cleaned, joined with a fresh sputter target and used again in another sputter coating process.

In one embodiment of the invention an oxide ceramic target may be bonded to a thermally incompatible backing plate material such as stainless steel. Here, a thin coating of In or In alloy may be applied to the backing plate surface to be joined to the target. These solders have liquidus temperatures of from about 100°–200° C. After application of this thin solder layer to the requisite backing plate surface, a high decomposition temperature solder paste is applied over this solder layer on the backing plate and is used to join the target to the backing plate.

In another embodiment, silicide targets may be bonded to backing plates by application of a thin solder layer of Sn or Sn alloy to a surface of the backing plate. These solders have melting points of about 200°–250° C. Then, a solder paste, as shall be explained in greater detail hereafter, is coated over this solder layer and applied to the intended interfacial surface of the target to effect a strong adherent bonding.

The invention will be further described in conjunction with the appended drawings and attached detailed description.

IN THE DRAWINGS

DETAILED DESCRIPTION OF THE INVENTION

Figure 1:
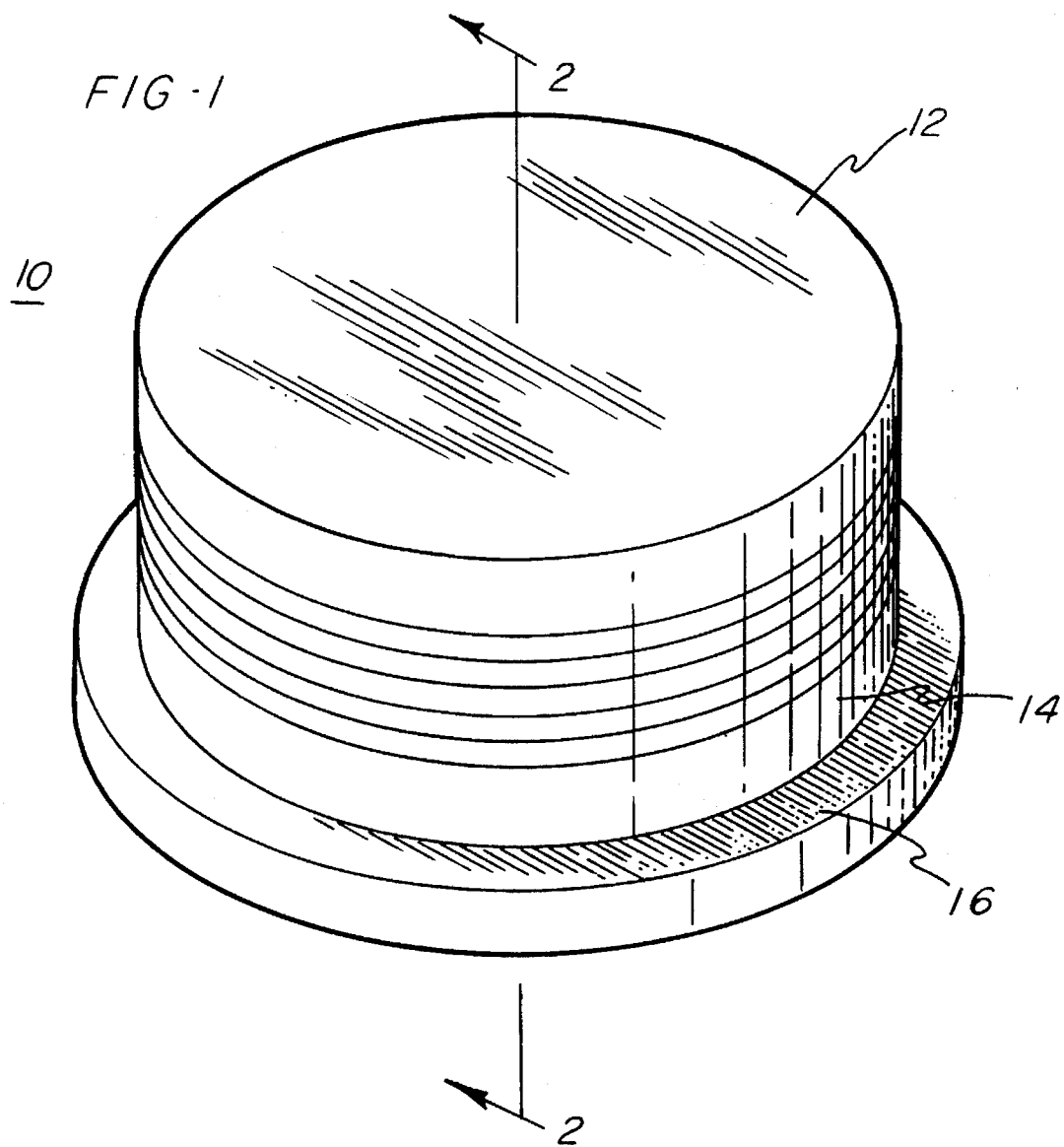
FIG. 1 is an isometric view of a bonded target/backing plate assembly in accordance with the invention.

Turning first to FIG. 1 of the drawings, there is shown a bonded target/backing assembly in accordance with the invention. As shown in FIG. 1, target 12 is composed of an oxide-ceramic material such as indium tin oxide. Target 12 is superposed over heat conductive backing plate 14, here composed of stainless steel. A peripheral flange 16 integral with backing plate 14 serves to mount the assembly as a cathode in an evacuated sputter coating housing in accordance with well known techniques. The top, planar surface of target 12 is composed of the desired material that, in accordance with conventional sputter coating methods, will be deposited as a thin coating along the substrate.

Figure 2:
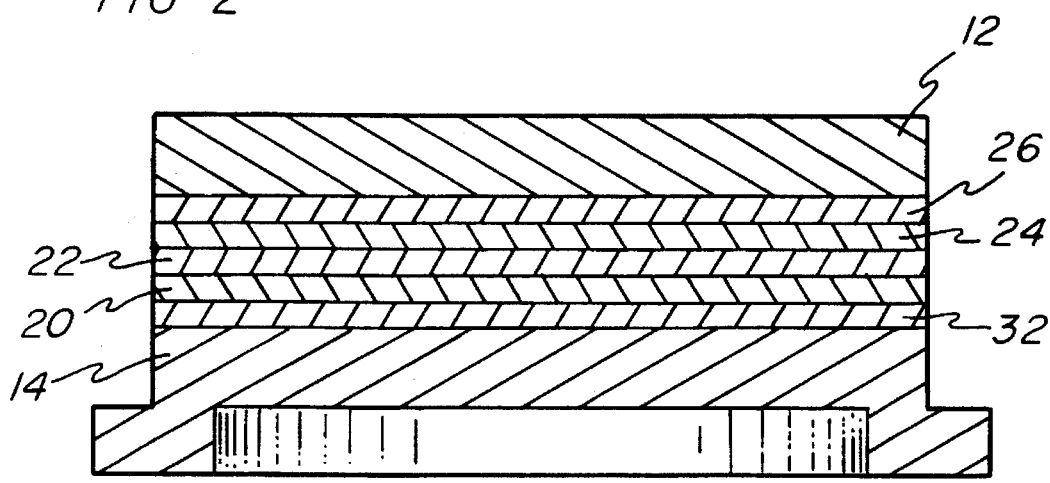
FIG. 2 is a transverse cross-sectional view of the target/ backing plate assembly of FIG. 1, taken along the lines and arrows 2—2 in FIG. 1.

As shown in FIG. 2, a thin layer 32 of nickel is placed over the top surface of backing plate 14 to serve as an adhesive layer. This is desired when the backing plate is composed of a difficult to solder material such as stainless steel or aluminum. Layer 32 is from about 0.5 to 2.0 µm in thickness, preferably about 1 µm in thickness, and is electroplated over the top surface portion of backing plate 14. Adhesive layer 32 provides a suitable substrate for application of solder thereon.

As is conventional in the art, the bottom or underneath surface 38 of backing plate 14 may be water cooled so as to dissipate heat resulting from the sputtering operation. As shown, solderable layer 20 of copper is coated over adhesive layer 32. Layer 20 is from about 1–5 µm in thickness; preferable about 2- µm. Solderable layer 20 may be sputter coated over the top surface of adhesive layer 32 although other conventional coating methods may be used.

Overlying solderable layer 20, a solder coating 22 of from about 25 to 1000 µms, preferably 500 microns in thickness, of indium, tin, or Sn—Ag solder is provided. The particular solder to be used is chosen carefully so that it will not melt during the cathodic sputtering process.

Accordingly, when oxide ceramic targets are employed in conventional sputtering apparatus, operating temperature of the target/backing plate assembly is normally maintained at about 100° C. or less. Here, the solder should be chosen to have a m.p. in excess of this temperature. In, melting at about 155° C., and Indium based solders such as certain of the In/St, In/Pb, and In/Sn/Pb solders may therefore be used as solder layer 22 in these situations. Exemplary solders include In 48 Sn; In 15 Pb; In 18 Pb 70 Sn; In 50 Pb and In 25 Pb. These solder materials therefore have liquidus temperatures within the range of about 100°–200° C.

In those cases in which silicide targets are provided, target operating temperatures during the sputtering process are somewhat higher than for the oxide ceramic targets. Accordingly, higher melting Sn and Sn—Ag solders are employed as the solder layer 22 as opposed to the indium based solders. These have liquidus temperatures ranging from about 200° C.–250° C.

Turning back again to FIG. 2, since the target shown in this embodiment is an oxide ceramic target, such as indium tin oxide, it is also desirable to place a thin solderable layer 26 of copper or other solderable material along the underside or bottom surface of the target. Similar to layer 20, solderable layer 26 has a thickness of about 1 to 5 µm in thickness and may be sputter coated along the bottom surface of the target. Solderable layer 26 provides a suitable surface for adherence of bonding material, namely metallic solder paste material thereto.

The target is bonded to the backing plate by application of a metallic solder paste 24 along the interfacial surfaces of the target and backing plate as defined by the underside portion of solderable layer 26 and top portion of solder layer 22.

The metallic solder paste used to form layer 24 and to bond the target to the backing plate is composed of a low melting metal component (i.e. 70° C. or less) and a solid solution component. The low melting point component may comprise for example alloys including In and/or Bi. The low melting component may be selected from the group of alloys of In 33.7 Bi Bi 17 Sn 25 In Bi 10 Cd 13.3 Sn 26.7 Pb Bi 11.6 Sn 18 Pb 21 In Bi 5.3 Cd 8.3 Sn 22.6 Pb 19.1 In or, the low melting metal component may be composed of elemental Ga or Ga containing alloy that are liquids at room temperature (i.e. 30° C. or less). In this respect, elemental Ga or Ga based alloy such as eutectic 62.5 Ga 21.5 In 16 Sn; 75.5 Ga 24.5 In; 95 Ga 5 In; or 63.14 In 32.10 Bi 4.76 Ga may be mentioned.

Due to toxicity concerns, the use of low melting alloy components that contain Pb and/or Cd should be avoided.

The solid solution component of the metallic solder paste comprises at least two metals and is prepared by mechanical alloying techniques such as ball milling the elements to provide a fine particle powder like solid solution or extended solid solution of at least two metals.

The low melting point component is present in an amount of about 75 wt. %–35% of the combined weight of the low melting point component and solid solution component. Preferably, the low melting point component is present in an amount of about 65%–55 wt. %.

The mechanically alloyed solid solution component of the metallic solder paste comprises a mechanically alloyed mixture of metal components (a) and (b) wherein (a) is a member or members selected from metals of groups IB, VIII and IVB of the periodic chart. The second class of metals (b) consists of metals from the groups IV A, IIIA and VA of the periodic chart.

The metal components (a) and (b) of the solid solution may be present (based upon total weight of (a) and (b)) in an amount of about 60–80 wt. % (a) and 40–20 wt. % (b). The component (a) metals are generally higher melting than the (b) components. More specifically, metal components (a) have melting points on the order of about 1000° C.–1875° C. Conversely, the metal (b) components have melting points of less than about 1000° C.

Component (a) preferably comprises a member or members selected from Cu, Fe, Co, Ni, or Ti. Component (b) preferably comprises one or more of Ge, Sn, Pb, Al, Bi, Ga, or In. This alloy (a) and (b) should show a solid solution x-ray diffraction and particle sizes should be on the order of 5 to 100 microns.

Based upon presently available data, the preferred low melting point component of the metallic solder paste is a liquid alloy comprised of 62.5 Ga, 21.5 In, 16 Sn. This is an eutectic alloy having a liquidus temperature of 10.7° C.

As to the solid solution component of the metallic solder paste, this preferably comprises a Cu—Sn alloy, most preferably Cu 20–25 wt. % Sn. Mechanical alloying of this mixture is achieved by well-known techniques such a high energy ball milling as described in *Material Science And Technology,* editors Cahn, Haasen and Kramer, Volume 15, 1991, pp. 194–198. The mixed powders are worked in a ball mill for a period of time depending on milling conditions such as ball to powder charge ratio, rotation speed, etc. Generally, the mixed powders are mechanically alloyed for a period of about 30 minutes to 2 hours, with 90 minutes being preferred. This results in a solid solution having particles on the order of between about 5–100 microns with crystal sizes within the nanocrystalline range, normally from about 2–100 nm. Other mechanically alloyed solid solutions that can be mentioned are the Cu—In, Cu—Ga, and Cu—Bi solid solutions.

The low melting point component and mechanically alloyed solid solution component of the metallic solder paste are mixed at a temperature in slight excess of the melting point of the low melting point component in the desired proportions in a vibrating pan or the like for a period of about 10 seconds–5 minutes, preferably 2 minutes to form the desired solder paste.

Once the solder paste is obtained, it should be used to join the target and backing plate within about 30 minutes or so, otherwise, it will prematurely solidify. The paste substance is then coated in a thin layer of about 200 µm to 1000 µm, preferably 500 µm, along the target and backing plate surfaces to be bonded. Temperature of the target and backing plate interfacial surfaces is maintained higher than the m.p. of the low melting point component during application of solder paste 24 to ensure wetting of the surfaces. The surfaces to be joined should be cleaned via sand blasting or the like prior to the bonding method. A compression force may be exerted perpendicular to the coated layer to aid in bonding of the target and backing plate.

Of significant advantage of the use of metallic solder paste 24 is the fact that the paste can be applied to the target/backing plate interfacial surfaces with little or no heating of these parts. In contrast with many of the prior art solder joining arrangements, high temperature heating of the parts during solder application was required. As previously mentioned, this oftentimes resulted in target and backing plate warpage and part cracking or deterioration. These problems are minimized since the solder paste may be applied at about room temperature (i.e. 30°–40° C. or less) or with only a slight heating requirement (i.e. heating from above the m.p. of the liquid component to about 100° C.)

The metallic solder paste 24 is allowed to solidify over a period of from 16 to 48 hours at temperatures ranging from ambient up to about 100° C. This solidification or curing step may be conducted in the presence of air, under an inert gas blanket such as argon, or in a vacuum. Upon solidification, a durable solder bond is formed with the solder paste being stable up to about 400°–600° C.

Figure 3:
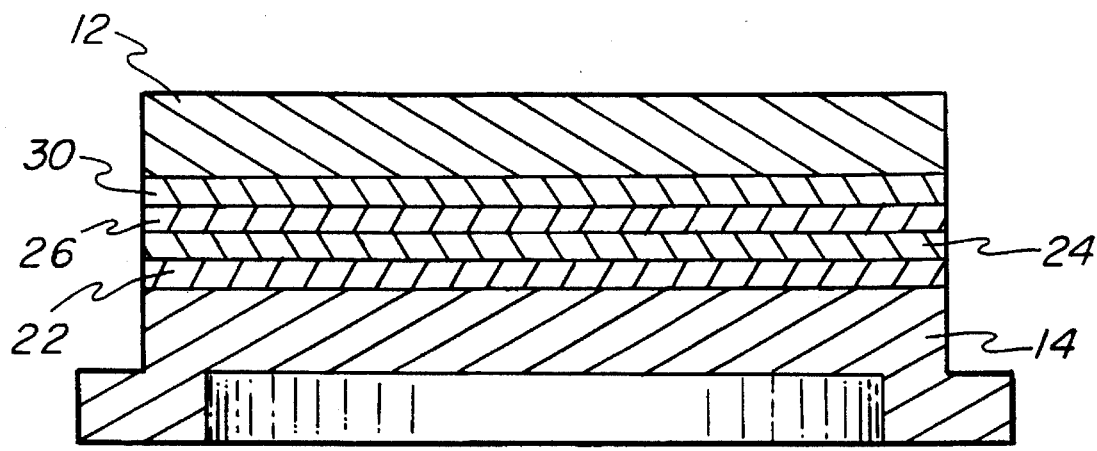
FIG. 3 is a transverse cross-sectional view of a target/ backing plate assembly similar to the view shown in FIG. 2, but showing another embodiment of the invention.

FIG. 3 shows a transverse cross-sectional view of another embodiment of a target/backing plate assembly in accordance with the invention. Here, target 12 is a silicide target, such as $MoSi_2$, $WSi_2$, $TaSi_2$ or $TiSi_2$. In this embodiment, backing plate 14 is composed of copper.

With further reference to FIG. 3, directly overlying backing plate 14 is solder layer 22 composed preferably of tin or tin/silver solder materials.

Since the target in the FIG. 3 embodiment is a silicide construction, a thin layer 30 of nickel or nickel alloy is placed along the underside target side and serves as an adhesive substrate for placement of solderable layer 26 thereover. The adhesive layer 30 is preferably 0.5 to 2.0 µms in thickness and may be applied over the bottom side surface of silicide target by conventional means such as electroplating.

Solderable layer 26 of 2 to 5 µms in thickness is coated over the adhesive layer 30 to provide a suitable layer for subsequent application of metallic solder paste layer 24 thereon to bond the target to the backing plate. Solderable layer 26 is preferably composed of Cu or Cu alloy.

Turning back now to the structure shown in FIG. 2, in order to assemble this target/backing plate combination, the oxide ceramic target and stainless steel backing plate may be surface cleaned via sandblasting or the like prior to application of the nickel layer to the top of the backing plate and the subsequent application of the solderable Cu layers 26,20 over the bottom and top surfaces of the target and backing plate respectively. After the solderable layer 20 has been applied to the backing plate, the backing plate is heated to the m.p. of the solder used and solder layer 22 applied over the top surface of solderable layer 20. Solder layer 22 is then allowed to solidify.

After the backing plate has cooled, the interfacial or mating surfaces of the target and backing plate, namely layers 26,22, are cleaned and metallic solder paste layer 24 may be applied over these interfacial surfaces. As previously stated, this solder paste material is applied at low temperature, preferably room temperature, so the parts need no or only slight heating during the target/backing plate bonding process. The solder paste is then allowed to solidify, resulted in a bonded target/backing plate assembly.

In assembling the combination shown in FIG. 3, after cleaning, the top surface of backing plate 14 is heated to the melting point of the solder used and solder layer 22, here preferably composed of Sn or Sn/Ag based solder is applied thereto. The underside of target 12 is coated with adhesive layer 30, preferably Ni or Ni alloy. This surface is cleaned and then solderable layer 26, preferably Cu, is coated over the adhesive layer 30 via sputtering techniques. The solder paste layer 24 is then provided between the interfacial surfaces 26,22 at low temperature ranging from ambient to about 100° C.

In accordance with the invention, after the thus bonded target/backing plate assembly has been used in the sputtering process, and the target material consumed, the assembly can be disassembled in such manner that the backing plates may be saved and reused.

The metallic solder paste layer 24 has a high decomposition temperature, usually on the order of 400°–600° C. and higher due to the formation of intermetallic compounds. By reason of the fact that solder layer 22 has been provided as part of the multilayer structure located between the backing plate and solder paste layer 24, the assembly may be disassembled by simply heating it to a temperature that is greater than the m.p. of the solder used in layer 22. The backing plate is readily separated from the assembly and wiped clean, ready for reuse. Meanwhile, the spent target remains and high decomposition temperature solder paste layer 24 adhering thereto can be disposed of.

It is therefore apparent that a method of assembling and disassembling a sputter target and backing plate are provided. A solder layer is applied to the backing plate top surface. The solder paste material as described above is then placed between the solder layer and the underside surface of the target. After the target and backing plate are joined by means of the solder paste material, the assembly can be disassembled simply by heating the solder layer to its melting point. The target and backing plate are then separated. Another target may be provided and joined to the original backing plate, thereby resulting in recycling or reuse of the backing plate. Of course, this recycled backing can be provided with another solder layer in accordance with the invention prior to bonding with the second or subsequent target by use of the metallic solder paste.

Whether an oxide ceramic target or silicide target is utilized, the solder layer 22 will be chosen so as to have a liquidus temperature that is higher than the operating temperature of the assembly during the sputtering process. Accordingly, use of the joined target/backing plate will maintain its integrity during sputtering. However, due to the high decomposition temperature of the metallic solder paste 24, and the fact that the liquidus temperature of the solder 22 is lower than this decomposition temperature, after sputter usage, the backing plate may be readily separated from the target by heating the assembly to the liquidus temperature of the solder 22.

Figure 4:
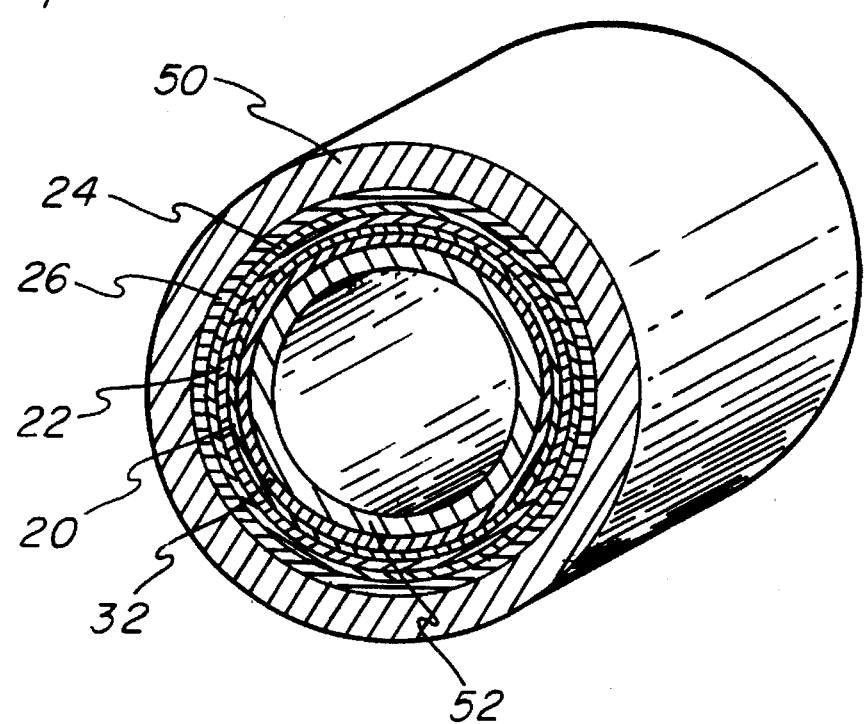
FIG. 4 is a perspective view of another bonded target/ backing plate assembly in accordance with the invention.

Turning now to FIG. 4, there is shown another embodiment which is similar to the target/backing plate assembly combination shown in FIGS. 1 and 2, with the exception that the target and backing plate and layers 32, 20, 22, 24 and 26 utilized to join the target and backing plate are tubular in shape. As shown, elongated tubular target 50 is composed in this embodiment of indium tin oxide. Target 50 is mounted over coaxially disposed tubular backing member 52, here composed of stainless steel.

Similar to the structure shown in FIG. 2, a thin layer of nickel is provided over the backing plate 52 to serve as an adhesive layer 32. Solderable layer 20, preferably composed of copper, is provided over the adhesive layer 32. Overlying solderable layer 20, solder layer 22, here composed of In or In alloy, is provided.

Again similar to FIG. 2, the inside diameter of tubular target 50 is coated with a thin solderable layer 26 of copper. Solder paste 24 is provided along the tubular interface defined between surfaces 26,22 to bond the target to the backing plate.

While the forms of the methods and structural combinations described herein constitute different embodiments of the invention, it is to be understood that the invention is not limited to these precise methods and structural combinations described and that changes may be made therein without departing from the scope of the invention which is defined in the appended claims.

What is claimed is:

1. Method of assembling and disassembling a sputter target and a backing plate comprising:
   (a) providing a sputter target having a first surface from which coating material is to be ejected to coat a desired substrate and a second surface adapted to mate with said backing plate;
   (b) providing a backing plate member having a top surface adapted to mate with said target along said target second surface;
   (c) applying a solder layer to said backing plate top surface;
   (d) placing a bonding material between said solder layer and said second surface of said target and joining said target and said backing plate;
   (e) heating said solder layer to its melting point;
   (f) separating said target from said backing plate;
   (g) providing another target; and
   (h) joining said other target to said backing plate.

2. Method as recited in claim 1 wherein subsequent to said step (f) and prior to said step (h), said method comprises (i) applying another solder layer to said backing plate top surface.

3. A method as recited in claim 2 wherein said step (g) comprises applying a solder paste material over said other solder layer formed in step (i).

4. A method as recited in claim 1 wherein said target comprises an oxide ceramic material and wherein said solder layer comprises In or In alloy solder material.

5. A method as recited in claim 4 wherein said backing plate comprises stainless steel.

6. A method as recited in claim 1 wherein said target comprises a silicide material and wherein said solder layer comprises tin or tin alloy solder material.

7. A method as recited in claim 6 wherein said backing plate comprises copper.

8. Method of assembling a sputter target to a backing plate, comprising:
   (i) applying a solder material to a first surface of said backing plate, said first surface being adapted to bond to a surface of said sputter target; said solder material having a liquidus point of about 100° to 250° C.;
   (ii) applying a bonding material along a surface of said target and said first surface of said backing plate at a temperature of about ambient to 70° C. and bonding said backing plate to said target; said bonding material having a decomposition temperature above said liquidus point of said solder material.

9. Method as recited in claim 8 further comprising:
   (iii) heating said solder material in said bonded backing plate and target to a temperature equal to or exceeding said liquidus temperature; and
   (iv) separating said target from said backing plate.

10. Method as recited in claim 9 wherein said solder material is In or Indium alloy solder.

11. Method as recited in claim 9 wherein said solder material is Sn or Sn alloy.

12. Method as recited in claim 11 wherein said solder material is Ag—Sn alloy.

13. Method as recited in claim 10 wherein said target comprises an oxide ceramic material.

14. Method as recited in claim 13 wherein said oxide ceramic material comprises indium tin oxide.

15. Method as recited in claim 11 wherein said target comprises a silicide material.

16. Method as recited in claim 15 wherein said silicide material is a member selected from the group consisting of $WSi_2$, $TiSi_2$, $TaSi_2$, and $MoSi_2$.

17. In a target and backing plate assembly of the type wherein said target and backing plate are joined together along interfacial surfaces by a metallic bonding material and wherein a solder material is disposed along the interfacial surface of said backing plate adjacent said metallic bonding material, a method for separating said target and backing plate so that said backing plate may be reused, said method comprising:

heating said solder material to a temperature equal to or in excess of the liquidus temperature of said solder material;

separating said target from said backing plate.

18. Method as recited in claim 17 further comprising cleaning said backing plate.

19. Method as recited in claim 17 further comprising providing a second target, and subsequent to said separating, joining said second target and said backing plate.

20. Method as recited in claim 17 wherein said bonding material is a metallic solder paste having a decomposition temperature of about 400° C. to 600° C.

21. Method as recited in claim 17 wherein the liquidus temperature of said solder material is about 100°–250° C.

22. In a sputter target and backing plate combination wherein said sputter target and backing plate are bonded together along interfacial surfaces by a high decomposition temperature bonding material, the improvement comprising a thin solder layer of between about 1 to 1000 µm located between said bonding material and said backing plate, said solder layer being composed of a solder material having a liquidus temperature below the decomposition temperature of said bonding material.

23. Combination as recited in claim 22 wherein said solder material has a liquidus temperature of about 100° to 250° C.

24. Combination as recited in claim 22 wherein said target is composed of an oxide ceramic material.

25. Combination as recited in claim 23 wherein said solder material is chosen from the group consisting of Indium and Indium alloys.

26. Combination as recited in claim 22 wherein said target comprises a silicide material.

27. Combination as recited in claim 26 wherein said solder material is chosen from the group consisting of tin and tin alloys.

28. Combination as recited in claim 27 wherein said solder material comprises tin-silver alloy.

29. Combination as recited in claim 22 wherein said bonding material has a decomposition temperature of about 400° C. and greater.

* * * * *